United States Patent [19]

Kitaev et al.

[11] 3,934,985

[45] Jan. 27, 1976

[54] MULTILAYER STRUCTURE

[76] Inventors: Georgy Avenirovich Kitaev, ulitsa Mira 36, kv. 30; Vadim Alexandrovich Ploskikh, ulitsa Bazhova, 76, kv. 32, both of Sverdlovsk; Viktor Alexeevich Minkov, Leningradskoe shosse, 86/1, kv. 81; Viktor Georgievich Kurbakov, Leningradskoe shosse, 56, kv. 231, both of Moscow; Evangelina Mikhailovna Chernysheva, ulitsa Ekskavatornaya, 50, kv. 6, Sverdlovsk; Tatyana Nikolaevna Zlatkovskaya, ulitsa 40 let Oktyabrya, 26, kv. 48, Sverdlovsk; Viktor Timofeevich Brunov, ulitsa Belinskogo, 8/10 kv. 14, Sverdlovsk, all of U.S.S.R.

[22] Filed: Oct. 1, 1973

[21] Appl. No.: 402,626

[52] U.S. Cl. ................... 29/183.5; 29/191; 29/195
[51] Int. Cl.² .......................................... B32B 15/04
[58] Field of Search... 29/191, 191.4, 195 M, 195 S, 29/195 L, 195 P, 183.5; 174/68.5; 317/101 CM; 204/15

[56] References Cited

UNITED STATES PATENTS

| | | | |
|---|---|---|---|
| 3,301,939 | 1/1967 | Krasnow | 204/15 X |
| 3,340,607 | 9/1967 | Shutt | 204/15 X |
| 3,471,348 | 10/1969 | Shaheen et al. | 204/15 UX |
| 3,628,999 | 12/1971 | Schneble, Jr. et al. | 317/101 B X |
| 3,654,097 | 4/1972 | Degnan | 204/15 |
| 3,660,726 | 5/1972 | Ammon et al. | 174/68.5 X |
| 3,691,632 | 9/1972 | Smith | 174/68.5 X |
| 3,739,469 | 6/1973 | Dougherty, Jr. | 174/68.5 X |
| 3,760,091 | 9/1973 | Cannizzaro et al. | 317/101 CM X |

*Primary Examiner*—C. Lovell
*Assistant Examiner*—O. F. Crutchfield
*Attorney, Agent, or Firm*—Haseltine, Lake & Waters

[57] ABSTRACT

A multilayer structure comprising alternating metal and dielectric layers and having intralayer junctions for interconnecting the metal layers. The intralayer junctions are made integral with end faces of the metal layers.

2 Claims, 10 Drawing Figures

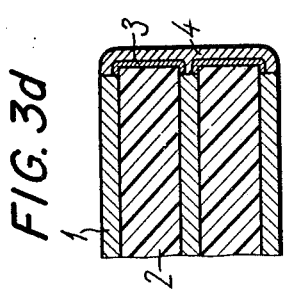
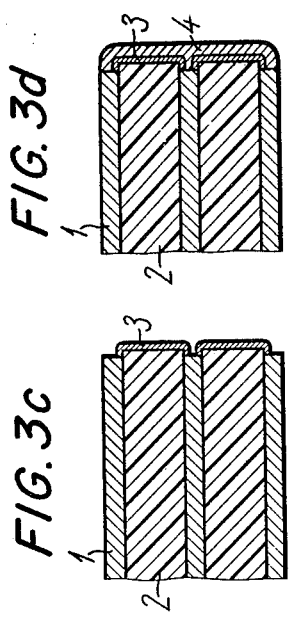
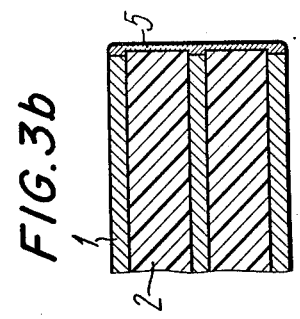
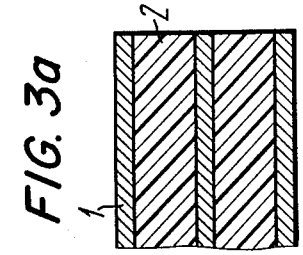
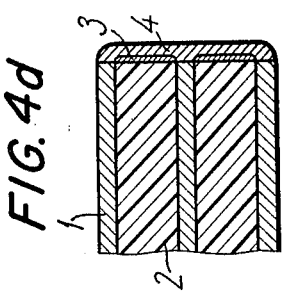
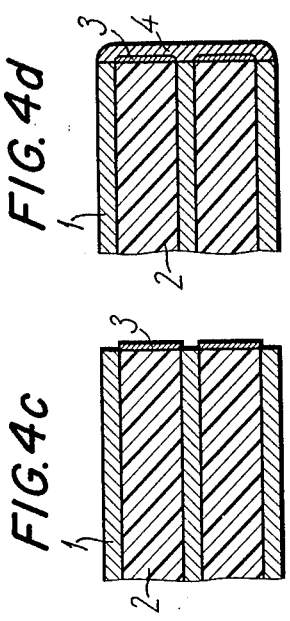
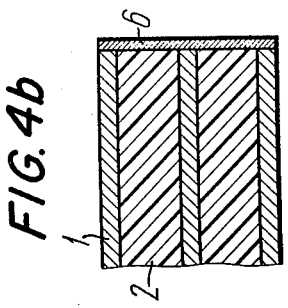
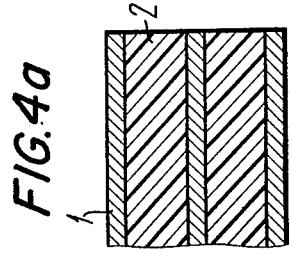

MULTILAYER STRUCTURE

The invention relates to the art of manufacturing switching elements of radio and electronic equipment, and more particularly to multilayer structures, such as printed circuit boards, large-sized integrated circuits, loops and the like, by a method of forming intralayer junctions in the multilayer structures.

Prior art multilayer structures comprise alternating metal and dielectric layers, wherein the metal layers are connected together by means of intralayer junctions comprising metal films applied to the end faces (projections) of the dielectric and metal layers of the multilayer structure.

In prior art structures the intralayer metal junctions are made in the form of metal films whose density and electric conductance at the point of their contact with the metal layer can but approximate these properties of the metal layers. It is known that the intralayer metal junctions are separated from the metal layers of the multilayer structure by intermediate interlayers, e.g. by oxide films or electrically conductive lacquers, whereby electric resistance between the metal layers of the structure is increased and the mechanical strength of the structure having the intralayer junctions connecting the metal layers together is reduced.

It is known to form intralayer metal junctions in a multilayer structure comprising alternating metal and dielectric layers by forming an auxiliary electrically conductive film on the surface of the dielectric and metal layers, which is to be metal plated, by the method of electrolytical deposition of a metal film. This prior art method essentially consists in a non-electrical deposition of a metal film from solutions containing a reducer onto the surface of the metal and dielectric layers, which are to be metal plated, and in the subsequent electrolytical deposition of a metal film.

An auxiliary copper film is the most frequently used for that purpose, which is deposited from alkaline solutions of complex copper salts containing formalin as reducer. In some cases auxiliary films of nickel or cobalt are deposited which contain phosphorus, in particular from acid solutions of salts of these metals by depositing the metal with hypophosphite. Still less frequently auxiliary silver, palladium or the like films are used which are obtained by the method of a non-electrical deposition from solutions of salts of these metals containing dissolved reducers.

It is also known to form auxiliary electrically conductive films by applying electrically conductive adhesives and lacquers to the surface of the metal and dielectric layers to be metal plated.

In the case, where auxiliary electrically conductive films are deposited from alkaline solutions containing metal salts and a reducer, such as non-electrically deposited films of silver and the like, onto a multilayer structure comprising alternating layers of a dielectric and a non-rare metal, such as copper, the treatment of the structure with an alkaline solution will inevitably result in oxidation of the metal layers prior to the non-electrical deposition of the auxiliary electrically conductive film. In such cases, along with the auxiliary electrically conductive film, the intralayer metal junctions also comprise an oxide film separating the metal layers of the structure from the auxiliary electrically conductive film.

It is also known to form intralayer metal junctions in a multilayer structure comprising alternating copper and dielectric layers by forming the intralayer metal junctions from alkaline solutions for thick-layer non-electrical copper plating, such methods involving in some cases electrolytical deposition of a metal film.

In all the above-described methods the auxiliary electrically conductive film is used to form intralayer metal junctions in a multilayer structure by the method of electrolytical deposition of a metal film and constitutes a component of the intralayer metal junctions thus comprising an intermediate link between the metal of the layers and the electrolytically deposited film.

All the above-mentioned methods of forming the auxiliary electrically conductive film involve the utilization of expensive solutions which become more or less unstable upon the introduction of reducers into them, or the use of expensive electrically conductive adhesives or lacquers.

It is an object of the present invention to provide a multilayer structure comprising alternating metal and dielectric layers and having intralayer junctions adapted to interconnect the metal layers, which exhibit a stable minimum resistance between the metal layers of the structure and the maximum possible strength of a joint between the intralayer junctions and the end faces of the metal layers of the multilayer structure.

The invention uses a method of forming intralayer junctions in the novel structure with the use of stable and inexpensive plating solutions for forming auxiliary electrically conductive films in the form of insoluble electrically conductive metal compounds on the end faces of the dielectric layers of the multilayer structure in such a manner that the auxiliary electrically conductive films provide for the electrolytical deposition of a metal directly onto the end faces of the metal layers of the structure.

These objects are accomplished in that in a multilayer structure comprising alternating metal and dielectric layers and having intralayer junctions adapted to interconnect the metal layers, according to the invention, the intralayer junctions are made integral with the end faces of the metal layers.

The end faces of the dielectric layers coated with the intralayer junctions, are preferably divided by additional metal layers extending in parallel with the layers of the structure into portions of a thickness approximately equal to that of the thinnest dielectric layer.

The invention uses a method of forming intralayer junctions in a multilayer structure comprising the step of forming an auxiliary electrically conductive film on the surface of the dielectric layers to be metal plated by the electrolytical deposition of a metal film, wherein, according to the invention, the auxiliary film is formed by immersing the multilayer structure into a solution containing ions of a metal, which is more electro-positive in the voltage series than the metal of the metal layers, allowing the structure to stay in said solution until the formation of a continuous electrically conductive film of the metal, whose ions are contained in said solution, over the entire surface to be metal plated, said film having a monolithic structure in the dielectric zones of that surface and a porous structure in the metal zones thereof, with subsequent treatment of the structure with a solution selectively reacting with the metal of the metal layers or with the metal of the metal layers and with the porous zones of the continuous electrically conductive film so as to remove from the metal layers the zones of the continuous electrically conductive film having a porous structure.

Prior to the formation of the auxiliary film the end faces of the dielectric layers of the multilayer structure are preferably treated with a sensitizer solution.

The above objects are accomplished by forming an auxiliary electrically conductive film on the surface of the dielectric layers to be metal plated by the electrolytical deposition of a metal film. The auxiliary film is preferably formed by immersing the multilayer structure into a solution containing soluble complex salts, metal salts, pH-controlling additives and chalcogenizers, allowing the structure to stay in said solution until the formation of a continuous electrically conductive film of metal chalcogenides over the entire surface to be metal plated, with subsequent treatment of the structure with a solution selectively reacting with the metal of the metal layers or with the metal of the metal layers and with the zones of the film of metal chalcogenides disposed on the end faces of the metal layers so as to remove these zones.

It is an object of the present invention to provide a multilayers structure comprising alternating metal and dielectric layers and having intralayer junctions adapted to interconnect the metal layers, which exhibit a stable minimum resistance between the metal layers of the structure and the maximum possible strength of a joint between the intralayer junctions and the end faces of the metal layers of the multilayer structure.

In this case, prior to the formation of the auxiliary film and end faces of the dielectric layers of the multilayer structure are preferably treated with a solution containing ions of metals having a variable valency.

Furthermore, prior to the immersion of the structure into a solution for selectively removing the zones of the continuous electrically conductive film from the end faces of the metal layers the structure is preferably heat treated at 35°–400°C, preferably after the formation of the auxiliary electrically conductive film.

With any of the above-described methods of forming intralayer junctions it is desirable that the continuous electrically conductive film be formed in an alternating electric field.

The alternating electric field may be generated by applying an AC voltage to the metal layers of the structure. The alternating electric field may be also generated by applying an AC voltage to independent electrodes placed into a solution used to form the continuous electrically conductive film and disposed at the opposite sides of the structure.

With any of the above-mentioned methods of forming intralayer junctions the formation of the auxiliary electrically conductive film may be performed in an ultrasonic field.

It is suggested that in the method of forming intralayer junctions the formation of the continuous electrically conductive film of metals, which are more electrapositive in the voltage series than the metal of the metal layers, be performed in a solution containing:

| | |
|---|---|
| paladium salt | 0.0005 – 0.5 M/l |
| copper salt | 0.0005 – 0.5 m/l |
| inorganic acid | 0.001 – 1.0 M/l | or in a solution containing:

| | |
|---|---|
| silver salt | 0.0005 – 0.5 M/l |
| $NH_4OH$ | 0.1 – 12.5 M/l. |

It is preferred to use in the method of forming the continuous electrically conductive film of metal chalcogenides a solution containing:

| | |
|---|---|
| complex lead salt | $10^{-3} - 10^{-1}$ M/l |
| alkali | $10^{-2} - 5$ M/l |
| thiourea | $10^{-3} - 1$ M/l | or to form such a film in a solution containing:

| | |
|---|---|
| copper salt | $10^{-3} - 10^{-1}$ M/l |
| sodium acetate | $10^{-1} - 5$ M/l |
| thiourea | $10^{-3} - 1$ M/l. |

The multilayer structure according to the invention comprising alternating metal and dielectric layers and having intralayer junctions comprising films of an electrolytically deposited metal, wherein the intralayer junctions are made integral with the end faces of the metal layers, exhibits particularly high mechanical strength and minimum and stable electric resistance of the intralayer junctions.

One of the embodiments of the multilayer structure, wherein the end faces of the dielectric overcoated with the intralayer junctions are divided by additional metal layers extending in parallel with the layers of the structure into parts of a thickness approximately equal to that of the thinnest dielectric layer is of interest due to the fact that the intralayer junctions are made integral with the end faces of the metal layers, whereby the multilayer structure becomes additionally resistant to lamination of the dielectric and metal layers under severe operational conditions.

The new methods of forming intralayer junctions which comprise films of an electrolytically deposited metal directly connected to the end faces of the structure layers, exhibit the following advantages.

Since these methods allow for the formation of the auxiliary film only on the surface of the dielectric layers to be metal plated, it is possible to apply an electrolytically deposited metal film directly to the end faces of the metal layers of the multilayer structure.

Where the continuous electrically conductive film is formed of a metal which is more electropositive than the metal of the metal layers, the consumption of the metal of which the electrically conductive film is formed is minor due to localization of the continuous electrically conductive film mainly on the surface to be metal plated. In this case the consumption of solutions is also minor.

Where the continuous electrically conductive film is formed of metal chalcogenides, the components of the solutions comprise commonly available salts of copper, lead, nickel and the like metals forming complex compounds with addenda, such as with hydroxyl ion, acetate ion and the like, as well as inexpensive soluble compounds of the VI group. Such compounds as hydrogen sulphide, sodium sulphide, thiosulphate, selenosulphate, thiourea, thiosemicarbazide and the like react with the above-said complex metal salts with the formation of continuous electrically conductive films of difficultly soluble salts over the entire surface to be metal plated.

The advantages of the invention also consist in simple and rational utilization of the components of the solutions and high degree of reproducibility of the results in the serial and mass-scale manufacture of the multilayer structures having intralayer junctions adapted to connect the metal layers together.

The main advantage of the invention consists in the provision of the multilayer structures having intralayer junctions comprising films of an electrolytically deposited metal made integral with the end faces of the metal layers which results in high mechanical and electrical characteristics of the multilayer structures according to the invention.

The invention will now be described in detail with reference to the accompanying drawings, in which.

FIGS. 3a, b, c, d illustrate the steps of the method of forming intralayer junctions according to the invention;

FIGS. 4a, b, c, d illustrate the steps of another embodiment of the method of forming intralayer junctions.

Figure 1:
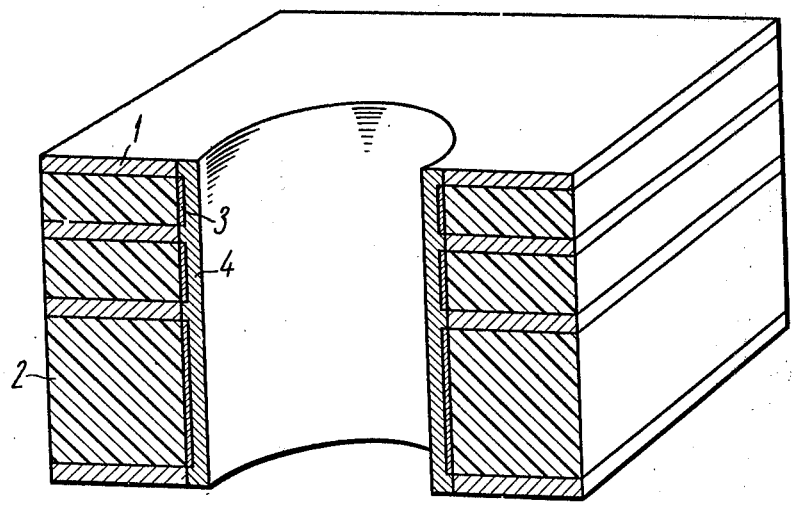
FIG. 1 shows a perspective view in section of a multilayer structure according to the invention.

A multilayer structure shown in FIG. 1 comprises metal layers 1 separated by dielectric layers 2, an auxiliary electrically conductive film 3 and an intralayer junction 4 comprising a film of an electrolytically deposited metal made integral with the end faces of the metal layers 1 of the multilayer structure.

Figure 2:
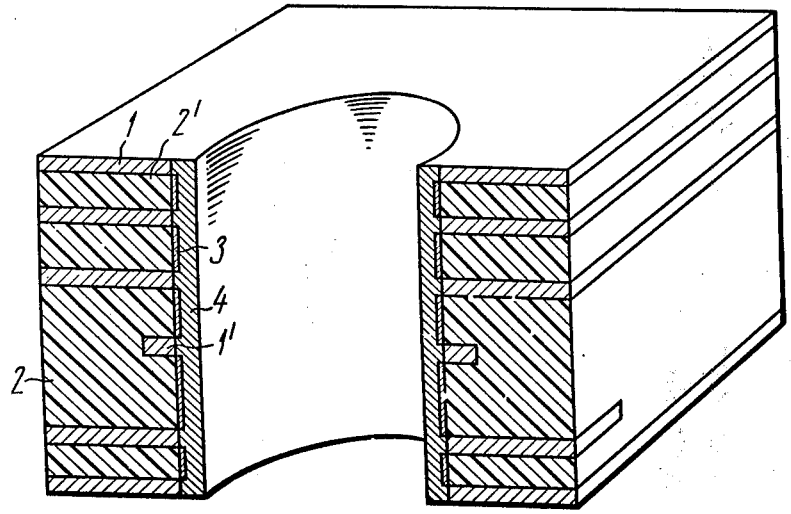
FIG. 2 shows a perspective view in section of one of the embodiments of the multilayer structure according to the invention.

FIG. 2 shows a multilayer structure in which, as differred from the multilayer structure shown in FIG. 1, the end faces of the dielectric layers 2 overcoated with the intralayer junctions 4 are separated by additional metal layers 1' extending in parallel with the layers 1 and 2 of the structure into parts of a thickness approximately equal to that of the thinnest layer 2' of the dielectric material.

The metal of the metal layers 1 and 1' of the multilayer structure shown in FIGS. 1 and 2 may be represented by a metal selected from the group consisting of Cu, Ag, Zn, Al, Pb, Sn, Ti, Fe, Ni. The additional metal layer 1' may be made in the form of a zone, which is not connected with the metal layer 1 in one and the same plane of the multilayer structure.

FIGS. 3a, b, c, d show the steps of forming the intralayer junctions 4 with the formation of a continuous electrically conductive film 5 of metals, which are more electropositive in the voltage series than the metal of the metal layers 1 of the structure.

FIGS. 4a, b, c, d show the steps of forming the intralayer junctions 4 with the formation of a continuous electrically conductive film 6 of metal chalcogenides.

The first manner of forming the intralayer metal junctions in a multilayer structure consists in the following:

A multilayer structure shown in FIG. 3a, is immersed into a bath with a solution containing ions of a metal, which is more electropositive in the voltage series than the metal of the metal layers. Such a solution may contain:

| AgNO$_3$ | 0.0005 – 0.5 M/l |
| --- | --- |
| NH$_4$OH | 0.1 – 12.5 M/l | or a solution containing:

| PdCl$_2$ | 0.0005 – 0.5 M/l |
| --- | --- |
| CuCl$_2$ | 0.0005 – 0.5 M/l |
| H$_2$SO$_4$ | 0.001 – 1 M/l | or a solution containing:

| PdSO$_4$ | 0.0005 – 0.5 M/l |
| --- | --- |
| HCl | 0.001 – M/l |

The structure is allowed to stay in the above-mentioned solution until the formation of a continuous electrically conductive film 5 (FIG. 3b) of silver or palladium. Thus, the silver or palladium film is formed both on the end faces of the metal layers and on the end faces of the dielectric layers 2 of the multilayer structure, the film having a monolithic structure on the end faces of the dielectric layers 2 and a porous structure on the end faces of the metal layers 1.

Prior to the immersion of the multilayer structure into one of the above-mentioned solutions the structure is preferably treated with one of conventional sensitizer solutions, containing e.g. ions of Sn$^{2+}$ or Ti$^{3+}$. This operation greatly accelerates and the process of the formation of the continuous electrically conductive film and makes this process more uniform.

In some cases the formation of the continuous electrically conductive film may be conducted in an alternating electric field. For that purpose an AC voltage is applied to the outer metal layers of the multilayer structure, or independent electrodes are placed into the bath containing the solution, the multilayer structure being disposed therebetween. Where the process is conducted in an alternating electric field, the formation of the continuous electrically conductive film is accelerated by several times. The employment of the outer metal layers of the structure as electrodes will result in heating of the system due to the heat release during the current flow through the solution. In order to eliminate this disadvantage, in some cases independent electrodes are used, which are introduced into the solution and electrically insulated therefrom in such a manner that they do not result in its heating due to the ohmic resistance of the solution.

The rate of the formation of the continuous electrically conductive film in the above-mentioned solutions also depends upon the temperature of the solutions, an increase in the temperature accelerating the process.

In some cases the continuous electrically conductive film is formed with application of an ultrasonic field to the solution and the structure immersed into it.

Then the multilayer structure with the continuous electrically conductive film 5 formed on the end faces of the metal layers 1 and dielectric layers 2 is immersed into a solution selectively reacting with the metal of the metal layers 1 only. Where copper is used as the metal of the metal layers 1, this solution contains:

| CuCl$_2$.2H$_2$O | 10$^{-3}$ – 1.8 M/l |
| --- | --- |
| HCl | 10$^{-2}$ – 3 M/l | or this solution contains:

| (NH$_4$)$_2$S$_2$O$_8$ | 0.005 – 2.5 M/l |
| --- | --- |
| H$_2$SO$_4$ | 0,01 – 1 M/l | or this solution contains:

| | |
|---|---|
| $CrO_3$ | 0.005 – 1 M/l |
| $H_2SO_4$ | 0.01 – 1 M/l | or this solution contains:

| | |
|---|---|
| $NH_4OH$ | 0.01 – 2 M/l |
| $(NH_4)_2CO_3$ | 0.01 – 1 M/l |
| $(NH_4)_2S_2O_8$ | 0.005 – 2.5 M/l |

After the above-described treatment the porous zones of the continuous electrically conductive film 5 are removed from the end faces of the metal layers 1, whereas the monolithic zones on the end faces of the dielectric layers remain intact, whereby the auxiliary electrically conductive film 3 is formed as shown in FIG. 3c.

In some cases the sponge-like zones of the electrically conductive film 5 are removed by applying an ultrasonic field to one of the above-mentioned solutions and the structure immersed therein.

In a modified procedure the electrically conductive film 3 is formed in a solution selectively reacting with the metal of the metal layers 1 and with the porous zones of the continuous electrically conductive film 5. This solution contains:

| | |
|---|---|
| $H_2O_2$ | $3.10^{-4}$ – 9 M/l |
| $H_2SO_4$ | $10^{-4}$ – 2 M/l | or this solution contains:

| | |
|---|---|
| $H_2O_2$ | $3.10^{-4}$ – 9 M/l |
| $(NH_4)_2S_2O_8$ | 0.005 – 2.5 M/l |
| HCl | 0.003 – 3 M/l |
| Versene-T | 0.0004 – 0.3 M/l |

Then the structure is extracted from this solution, washed with water and passivated with an acid solution, such as with 10% solution of $H_2SO_4$.

The above-described treatment results in complete removal of the porous zones of the continuous electrically conductive film 5 from the end faces of the metal layers 1 of the structure.

After that the structure with the auxiliary electrically conductive film 3 formed in the above-described manner is dipped into any appropriate electrolyte to apply a metal film of a required thickness by the electrolytical method, whereby the intralayer metal junction is formed, which is integral with the end faces of the metal layers 1 of the multilayer structure.

The manner of forming intralayer junctions may be also be practiced as follows.

A multilayer structure shown in FIG. 4a is immersed into a solution containing soluble complex salts of metals of the I-VIII groups, additives controlling pH of the solution and chalcogenizers, that is the compounds containing elements of the VIb group. This solution contains:

| | |
|---|---|
| $Pb(CH_3COO)_2$ | $10^{-3}$ – $10^{-1}$ M/l |
| KOH | $10^{-2}$ – 5 M/l |
| $CS(NH_2)_2$ | $10^{-3}$ – 1 M/l | or this solution contains:

| | |
|---|---|
| $CuSO_4.5H_2O$ | $10^{-3}$ – $10^{-1}$ M/l |
| $NaCH_3COO$ | $10^{-1}$ – 5 M/l |
| $CS(NH_2)_2$ | $10^{-3}$ – 1 M/l |

The structure is allowed to stay in this solution for 5-60 minutes until the formation of the continuous electrically conductive film 6 (FIG. 4b) consisting of lead sulphide or copper sulphide. In the case, where the film of metal chalcogenide is formed of a metal different from that of the metal layers 1, the metal chalcogenide, whose ions are contained in the solution, is formed on the end faces of the dielectric layers 2, while on the end faces of the metal layers 1 a film of chalcogenides of the metal of the metal layers 1 of the structure is mainly formed.

In some cases the chalcogenide film is formed on the end faces of the structure under the action of an alternating electric field or by applying an ultrasonic field to the solution and the multilayer structure immersed into it as hereinabove described.

Then the structure is extracted from the solution, and is washed and dried in the air.

In some cases the structure having the continuous electrically conductive chalcogenide film 6 applied thereto is subjected to a heat treatment at 35°–400°C for 10–90 minutes after the extraction from the solution. The temperature and the exposure time depend upon the properties of the film 6 and of the material of the dielectric layers 2.

After that the structure is placed into a solution selectively reacting with the metal of the metal layers. Where copper is used as metal of the metal layers 1, this solution contains:

| | |
|---|---|
| $CuCl_2 . 2H_2O$ | $10^{-3}$ – 18 M/l |
| HCl | $3.10^{-2}$ – 3 M/l. |

The treatment is conducted at 25°–30°C for 5–30 s. Thus the zones of the chalcogenide film 6 are removed from the end faces of the metal layers 1 only, and the zones of the chalcogenide film 6 remain intact on the end faces of the dielectric layers 2, whereby the auxiliary electrically conductive film 3 is formed, which consists of chalcogenide and which is disposed only on the end faces of the dielectric layers 2 of the structure.

In order to ensure more uniform and careful cleaning of the end faces of the metal layers from chalcogenide in the case, where there is deposited chalcogenide of a metal different from that of the metal layers, a solution is used, which selectively reacts with the metal of the metal layers 1 and with the zones of the chalcogenide film 5 disposed on the end faces of the metal layers 1 of the structure.

For example, where a film of lead sulphide is formed on the end faces of the structure, in which the metal of the metal layers 1 is represented by copper, such solution may contain:

| | |
|---|---|
| $(NH_4)_2S_2O_8$ | $4.10^{-3}$ – 2 M/l |
| $(NH_4)_2CO_3$ | $10^{-2}$ – 1 M/l |
| $NH_4OH$ | $3.10^{-2}$ – 3 M/l |
| $NH_4Cl$ | $2.10^{-2}$ – 10 M/l. |

The treatment is conducted at 10°–30°C for 5–60 s.

The above-described treatment results in complete removal of chalcogenide from the end faces of the metal layers and in the formation of an auxiliary electrically conductive film 3 disposed on the end faces of the dielectric layers 2 only.

After that the structure is washed, passivated and dried in the air.

In some cases the structure having the auxiliary electrically conductive film applied thereto is subjected to a heat treatment at 35°–400°C for 10–90 minutes.

Then the structure is placed into an electrolytic bath, where a film of an electrolytic plating of a required thickness is deposited under current. Therefore the intralayer metal junctions are formed comprising the electrolytically deposited metal applied directly to the bare end faces of the metal layers 1 of the structure, that is the intralayer junctions are formed as an integral part of the end faces of the metal layers of the structure.

The invention will be better understood from the following specific examples, wherein the intralayer junctions are made integral with the end faces of the metal layers of the structure. In a number of the examples the above-mentioned multilayer structure is referred to as a printed circuit board as the most typical example of multilayer structures consisting of alternating dielectric and metal layers.

EXAMPLE 1

A multilayer structure of a size of 200 × 300 mm and thickness of about 1.6 mm consisting of four layers of copper and three layers of glass-filled epoxy dielectric, with the copper layers thickness being the same and equal to 0.035 mm and the thickness of the glass-filled epoxy dielectric being different in all layers and equal to 0.1 mm; 0.5 mm; 0.8 mm, said structure having 1000 drilled through holes of 1 mm diameter with the walls comprising alternating end faces of the copper and glass-filled epoxy layers, and the external planes of the outer copper layers being coated with a layer of a protective nitrocellulose lacquer, was immersed into a solution containing:

| | |
|---|---|
| $PdCl_2$ | $5.10^{-3}$ M/l |
| $CuCl_2.5H_2O$ | $5.10^{-2}$ M/l |
| $H_2SO_4$ | $1.2.10^{-1}$ M/l, | at 25°C and was allowed to stay in this solution for 10 minutes until the formation of a continuous electrically conductive film of metallic palladium having a porous structure on the end faces of the copper layers and a monolithic structure on the end faces of the glass-filled epoxy dielectric. A thickness of the monolithic palladium film on the dielectric did not exceed 200 nm. The structure, which has been thus treated, was extracted from the above-said solution, washed with current cold water for 1 minute and was then immersed into a solution containing:

| | |
|---|---|
| $H_2O_2$ | 4 M/l |
| $H_2SO_4$ | $10^{-1}$ M/l | at 30°C, and was then treated for 20 s until complete removal of the zones of the continuous electrically conductive palladium film having porous structure.

As a result of the above-described treatment an auxiliary electrically conductive palladium film was formed due to the partial removal of the palladium film only from the end faces of the copper layers of the structure, the palladium film remaining completely intact on the end faces of the glass-filled epoxy layers. After the above-described treatment the uninterrupted electric conductance of the holes walls was retained.

The resulting multilayer structure was washed with current water for two minutes, the protective lacquer layer was removed, the structure was prepared for electrolytical metal plating by cratching of the outer planes of the structure, passivated with 10% solution of sulphuric acid, washed with water and immersed into the boron-fluorine hydride bath for electrolytical copper plating, wherein the structure was allowed to stay for 45 minutes at the cathode current density $D_c = 3 A/dm^2$.

As a result of this treatment intralayer copper junctions were formed in all the holes of the multilayer structure, the junctions comprising a film of the electrolytic copper of the thickness of 0.045 mm applied directly to the end faces of the copper layers of said structure and connected to the end faces of the glass-filled epoxy dielectric by means of the auxiliary palladium film.

EXAMPLE 2

The multilayer structure described in Example 1, prior to the immersion into the solution for application of the continuous electrically conductive film, was treated in a sensitizer solution containing:

| | |
|---|---|
| $SnCl_2.2H_2O$ | $3.10^{-1}$ M/l |
| HCl | 1 M/l | at 25°C for 2 minutes.

The above-described treatment accelerated the process of the formation of the continuous palladium film by about 10 times. All further operations were conducted as described in Example 1.

EXAMPLE 3

A multilayer printed circuit board of a size of 480×320 mm and a thickness of about 3.5 mm consisting of 16 circuit layers and having 3000 holes of 0.8 mm diameter, wherein the walls of various holes had different numbers of end face circuit outlets non-uniformly distributed over the board thickness, the walls of the holes also comprising the end faces of the copper layers, which were not coupled with the circuit and were made in the form of additional contact flats, which were not connected to the circuit and disposed in all layers of the board in such a manner that the hole walls comprised uniform alternation of the end faces of the copper layers of 0.035 mm thickness and the end faces of glass-filled epoxy dielectric of 0.5 mm thickness, was treated in a sensitizer solution as described in Example 2, whereafter the board was washed with current watter and immersed into a solution containing:

| | |
|---|---|
| $AgNO_3$ | $5.10^{-2}$ M/l |
| $NH_4OH$ | 7 M/l | at 20°C, wherein the board was allowed to stay until the formation of a continuous silver film having a porous structure on the copper end faces and a monolithic structure on the dielectric end faces.

Then the board was extracted from the above-said solution, washed and dipped into a solution containing:

| | |
|---|---|
| CuCl$_2$.2H$_2$O | 1.5 M/l |
| HCl | 1 M/l | at 25°C and was treated in this solution for 25 s. As a result of this treatment an auxiliary electrically conductive silver film was formed in all the holes of the board in the form of the monolythic silver film on the dielectric end faces due to the fact that only porous zones of the continuous silver film were removed from the end faces of the copper layers of the hole walls. In this case the uninterrupted electric conductance of the hole walls was retained, whereby the electrolytical deposition of copper was performed as described in Example 1 in such a manner that the intralayer junctions comprising films of the electrolytically deposited copper were made integral with all copper end faces of the board hole walls, whereby the entire board proved to be additionally fastened by ribbed intralayer junctions over all layers and over the entire board area.

EXAMPLE 4

A multilayer printed circuit board of a size of 200×200 mm and of a thickness of about 2.2 mm consisting of 10 circuit layers and having 800 holes of 1 mm diameter with the walls comprising alternating copper and polyamide dielectric end faces was immersed into a solution containing

| | |
|---|---|
| Pb(CH$_3$COO)$_2$ | 10$^{-1}$ M/l |
| KOH | 1 M/l |
| CS(NH$_2$)$_2$ | 5.10$^{-1}$ M/l | at 25°C and was allowed to stay in this solution for 30 minutes. As a result of this treatment the end faces of the hole walls dielectric have been coated with an electrically conductive lead sulphide film of 200 nm thickness, whereas the end faces of the copper layers were coated mainly with a copper polysulphide film.

Then the board was washed and dipped into a solution containing:

| | |
|---|---|
| CuCl$_2$—2H$_2$O | 1.8 M/l |
| HCl | 2 M/l | and was allowed to stay at 25°C in this solution for 10 s. This treatment resulted in cleaning of only the end faces of the copper layers of the hole walls, an auxiliary electrically conductive film being formed during that treatment, which consisted of lead sulphide and was disposed on the end faces of the polyamide dielectric layers.

Then the board was washed with current water, passivated with 10% solution of sulphuric acid and dipped into a copper plating silicon-fluorine hydrate electrolyte under current with the current density $D_c$=3A/dm$^2$ for 50 minutes. The above-described treatment resulted in the formation of the electrolytically deposited copper intralayer junctions inseparably linked with the end faces of the circuit layers.

EXAMPLE 5

The multilayer board described in Example 3 was treated in the sensitizer solution described in Example 2, whereafter the board was dipped into a solution containing:

| | |
|---|---|
| CS(NH$_2$)$_2$ | 1 M/l |
| KOH | 10$^{-2}$ M/l | at 25°C and was allowed to stay in this solution for 30 minutes. Then the board was washed with current water and dipped into a solution containing:

| | |
|---|---|
| CuSO$_4$.5H$_2$O | 10$^{-2}$ M/l |
| NaCH$_3$COO | 1 M/l |
| Cs(NH$_2$)$_2$ | 10$^{-1}$ M/l | at 54°C and was allowed to stay in this solution for 56 minutes. The above-described treatment resulted in the formation of a continuous electrically conductive film consisting of copper sulphide of 150 nm thickness and having the resistivity of 500 ohm/cm$^2$.

After that the board was washed with current water, dried in the air for 15 minutes and placed into a drying cabinet, where it was allowed to stay at 80°C during 60 minutes.

The above-described heat treatment has resulted in a reduction of the resistivity of the copper sulphide film to 100 ohm/cm$^2$.

Then the board was dipped into a solution containing:

| | |
|---|---|
| (NH$_4$)$_2$S$_2$O$_8$ | 10$^{-2}$ M/l |
| (NH$_4$)$_2$SO$_3$ | 10$^{-2}$ M/l |
| NH$_4$OH | 10$^{-1}$ M/l |
| NH$_4$Cl | 10$^{-2}$ M/l | at 25°C and was allowed to stay in this solution for 10 s whereby copper sulphide was removed only from the end faces of the copper layers due to the underetching of copper with said solution. Subsequently the board having the auxiliary electrically conductive film thus formed was passivated with 10% solution of sulphuric acid and was dipped under current into a boron-fluorine hydrate bath for electrolytical copper plating at $D_c$=2A/dm$^2$ and was allowed to stay there for 50 minutes. The above-described treatment resulted in the formation of the intralayer junctions comprising films of the electrolytic copper applied directly to the end faces of the metal layers of the multilayer board.

EXAMPLE 6

The multilayer structure described in Example 1 was immersed into a bath containing the solution for application of a continuous palladium film as described in Example 1. An ultrasonic field was generated in the bath by means of a magnetostrictor, and the palladium film was deposited in the ultrasonic field under the following operating conditions:

| | |
|---|---|
| field frequency | 18 Kc/s |
| magnetizing current of the magnetostrictor | 18 A |
| anode voltage | 4.5 kV |
| output voltage | 250 - 280 V. |

The above-described treatment resulted in the uniform formation of a continuous electrically conductive film on the hole walls, the time of the formation of said film being the same as in Example 1, while the thickness was reduced by about five times. Then the structure was treated under the operating conditions described in Example 1.

EXAMPLE 7

The multilayer structure described in Example 1 having the continuous electrically conductive palladium film deposited on the end faces of the metal and dielectric layers was dipped into the solution containing:

| | |
|---|---|
| $(NH_4)_2S_2O_8$ | 1 M/l |
| $H_2SO_4$ | $10^{-1}$ M/l | in an ultrasonic bath operating under the conditions described in Example 6. This treatment resulted in uniform cleaning of the copper layers from the sponge-like zones of the continuous palladium film, the time of cleaning of the copper end faces being reduced to 5 s. Subsequent deposition of the electrolytic coating was performed as described in Example 1.

EXAMPLE 8

A multilayer structure of a size of 100×100 mm consisting of five alternating copper layers of 0.035 mm thickness and four layers of a ceramic dielectric material of 1 mm thickness and having two outer copper layers coated with a lacquer and connected to an AC power source was immersed into the solution containing:

| | |
|---|---|
| $PdSO_4$ | $5 \cdot 10^{-3}$ M/l |
| HCl | $10^{-2}$ M/l | and the structure was treated therein under the action of an alternating electric field having the following parameters:

| | |
|---|---|
| field frequency | 50 c/s |
| voltage | 2.5 V |
| current | 1 A | at 20°C.

The above-described treatment resulted in the formation of a continuous electrically conductive film of 100 nm thickness for 2 minutes.

Then the structure was washed with water, the sponge-like palladium zones were removed from the end faces of the copper layers, and the electrolytic coating was deposited as described in Example 1.

EXAMPLE 9

The multilayer structure described in Example 1 was placed into the solution for deposition of the continuous electrically conductive palladium film as described in Example 1 between two gold-plated reticular copper electrodes of a size of 200×300 mm extending in parallel therebetween and connected to an AC power supply source. The structure was placed in parallel with the independent electrodes at a distance of 20 mm from each of them. Alternating current of 4.5 A was applied to the independent electrodes at 4.8 V, and the structure was allowed to stay there at 20°C. This treatment resulted in heating of the solution and in uniform formation of a continuous electrically conductive palladium film on the hole walls of a thickness of 200 nm in 3.5 minutes. Subsequently the structure was treated under the operating conditions described in Example 1.

EXAMPLE 10

The multilayer printed circuit board described in Example 4 was placed into the solution for deposition of a continuous palladium film described in Example 1 between two independent reticular electrodes of varnished copper disposed in parallel therebetween immediately adjacent to said reticular electrodes. AC voltage of 500 V was applied to the independent electrodes insulated from the solution with the varnish layer, and the board was allowed to stay under these conditions at 25°C. This treatment resulted in the formation of a palladium film of a uniform thickness of 200 nm for 4.7 minutes. Further treatment of the board and the formation of the intralayer junctions were performed as described in Example 1.

What is claimed is:

1. A multilayer structure comprising: metal layers; dielectric layers disposed between and alternating with said metal layers; and intralayer junctions for interconnecting said metal layers, said junctions being integral with end faces of said metal layers, and being constituted by films of an electrolytically deposited metal.

2. The multilayer structure as defined in claim 1, further comprising additional metal layers extending parallel with said first-named metal layers in two portions of a thickness equal to that of the thinnest one of said dielectric layers, said additional metal layers separating end faces of said dielectric layers that are coated with said intralayer junctions.

* * * * *